(12) United States Patent
Chiu et al.

(10) Patent No.: US 12,232,333 B2
(45) Date of Patent: Feb. 18, 2025

(54) INTEGRATED CIRCUIT

(71) Applicant: TAIWAN SEMICONDUCTOR MANUFACTURING CO., LTD., Hsinchu (TW)

(72) Inventors: Chieh-Fei Chiu, Tainan (TW); Wen-Ting Chu, Kaohsiung (TW); Yong-Shiuan Tsair, Tainan (TW); Yu-Wen Liao, New Taipei (TW); Chih-Yang Chang, Changhua County (TW); Chin-Chieh Yang, New Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 18 days.

(21) Appl. No.: 18/361,483

(22) Filed: Jul. 28, 2023

(65) Prior Publication Data

US 2023/0380190 A1    Nov. 23, 2023

Related U.S. Application Data

(62) Division of application No. 17/032,155, filed on Sep. 25, 2020, now Pat. No. 11,751,405.

(51) Int. Cl.
| | |
|---|---|
| *H10N 70/20* | (2023.01) |
| *H10B 51/30* | (2023.01) |
| *H10B 51/40* | (2023.01) |
| *H10B 61/00* | (2023.01) |
| *H10B 63/00* | (2023.01) |
| *H10N 50/01* | (2023.01) |
| *H10N 50/80* | (2023.01) |
| *H10N 70/00* | (2023.01) |

(52) U.S. Cl.
CPC .............. *H10B 63/30* (2023.02); *H10B 51/30* (2023.02); *H10B 51/40* (2023.02); *H10B 61/22* (2023.02); *H10N 50/01* (2023.02); *H10N 50/80* (2023.02); *H10N 70/021* (2023.02); *H10N 70/063* (2023.02); *H10N 70/068* (2023.02); *H10N 70/231* (2023.02); *H10N 70/253* (2023.02); *H10N 70/841* (2023.02)

(58) Field of Classification Search
CPC .......................... H10N 70/826; H10N 70/063
See application file for complete search history.

(56) References Cited

U.S. PATENT DOCUMENTS

| | | |
|---|---|---|
| 7,718,988 B2 | 5/2010 | Lee |
| 10,038,139 B2 | 7/2018 | Chen et al. |
| 11,258,012 B2 | 2/2022 | Koty et al. |

(Continued)

*Primary Examiner* — Mark V Prenty
(74) *Attorney, Agent, or Firm* — Birch, Stewart, Kolasch & Birch, LLP

(57) ABSTRACT

A method for fabricating an integrated circuit is provided. The method includes depositing a dielectric layer over a conductive feature; etching an opening in the dielectric layer to expose the conductive feature, such that the dielectric layer has a tapered sidewall surrounding the opening; depositing a bottom electrode layer into the opening in the dielectric layer; depositing a resistance switch layer over the bottom electrode layer; patterning the resistance switch layer and the bottom electrode layer respectively into a resistance switch element and a bottom electrode, in which a sidewall of the bottom electrode is landing on the tapered sidewall of the dielectric layer.

20 Claims, 13 Drawing Sheets

(56) References Cited

U.S. PATENT DOCUMENTS

| | | |
|---|---|---|
| 11,751,405 B2 * | 9/2023 | Chiu .................. H10N 70/068 |
| 2009/0127604 A1 | 5/2009 | Noda |
| 2009/0140234 A1 | 6/2009 | Moniwa et al. |
| 2014/0021584 A1 | 1/2014 | Tu et al. |
| 2014/0070162 A1 | 3/2014 | Iwayama |
| 2015/0318333 A1 | 11/2015 | Narayanan et al. |
| 2018/0040817 A1 | 2/2018 | Chuang et al. |
| 2018/0097173 A1 | 4/2018 | Chuang et al. |
| 2018/0301624 A1 | 10/2018 | Yang et al. |
| 2018/0351099 A1 | 12/2018 | Yang et al. |
| 2018/0374895 A1 | 12/2018 | Hsu et al. |
| 2019/0131524 A1 | 5/2019 | Peng et al. |
| 2019/0165258 A1 | 5/2019 | Peng et al. |
| 2020/0035908 A1 | 1/2020 | Ku et al. |
| 2020/0066580 A1 | 2/2020 | Peng et al. |
| 2020/0075857 A1 | 3/2020 | Chou |
| 2020/0106011 A1 | 4/2020 | Chen et al. |
| 2020/0365655 A1 | 11/2020 | Chiu et al. |
| 2021/0013095 A1 | 1/2021 | Tran et al. |
| 2021/0035620 A1 | 2/2021 | Wang et al. |
| 2021/0217813 A1 | 7/2021 | Wang et al. |
| 2021/0272896 A1 | 9/2021 | Lin et al. |
| 2021/0351348 A1 | 11/2021 | Hsu et al. |
| 2022/0059618 A1 | 2/2022 | Hsu et al. |

* cited by examiner

INTEGRATED CIRCUIT

PRIORITY CLAIM AND CROSS-REFERENCE

This application is a divisional application of U.S. patent application Ser. No. 17/032,155, filed Sep. 25, 2020, the entirety of which is incorporated by reference herein in their entireties.

BACKGROUND

Many modern electronic devices contain electronic memory configured to store data. Electronic memory may be volatile memory or non-volatile memory. Non-volatile memory is able to store data in the absence of power, whereas volatile memory is not. Magnetoresistive random-access memory (MRAM) and resistive random access memory (RRAM) are promising candidates for next generation non-volatile memory technology due to relative simple structures and their compatibility with complementary metal-oxide-semiconductor (CMOS) logic fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
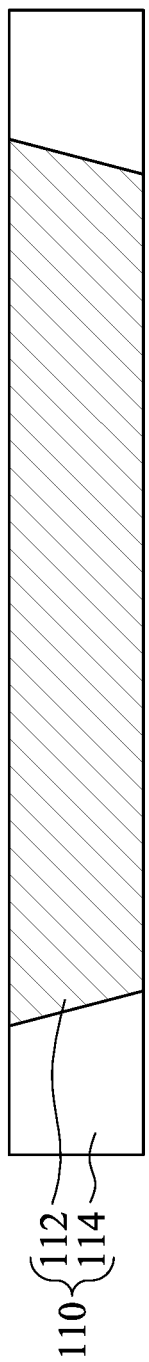
FIGS. 1-8 illustrate various stages in the formation of a memory device of an integrated circuit according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A non-volatile memory cell includes top and bottom electrodes, and a resistance switching element disposed between the top and bottom electrodes. The resistance switching element can be switched between different resistances that correspond to different data states, thereby enabling the non-volatile memory cell to store one or more bit of data. To fabricating the memory cells, a bottom electrode layer, a resistance switching layer, and a top electrode layer may be formed over a bottom interconnect structure and a dielectric layer having an opening exposing the bottom interconnect structure. Sometimes, the memory cell may have a raising portion on a top surface of the dielectric layer, which result in a step height between a top surface of the memory cell and a periphery region (e.g., logic region), which may decrease a process window of the following metallization layer $M_x$ when the memory cell is between the metallization layers $M_{x-1}$ and $M_x$.

In some embodiments, a bottom electrode via (BEVA) is fabricated with a large critical dimension by enlarging an opening of a dielectric layer surrounding the BEVA, such that the non-volatile memory cell can be formed over a tapered portion of the dielectric layer, thereby reducing the step height between a top surface of the memory cell and a periphery region (e.g., logic region). In the exemplary embodiments, the non-volatile memory cell is illustrated as resistive random-access memory (RRAM) cell. In some other embodiments, the non-volatile memory cell may be magnetic random-access memory (MRAM) cell, conductive-bridging random-access memory (CBRAM) cell, ferroelectric random-access memory (FeRAM) cell, phase change random-access memory (PCRAM) cell, or the like.

An integrated circuit including a memory cell and the method of fabricating the same are provided in accordance with various exemplary embodiments. The intermediate stages of fabricating the integrated circuit are illustrated. Variations of the embodiments are discussed. Throughout the various views and illustrative embodiments, like reference numbers are used to designate like elements.

FIGS. 1-8 illustrate various stages in the formation of a memory device of an integrated circuit according to some embodiments of the present disclosure. The illustration is merely exemplary and is not intended to limit beyond what is specifically recited in the claims that follow. It is understood that additional operations may be provided before, during, and after the operations shown by FIGS. 1-8, and some of the operations described below can be replaced or eliminated for additional embodiments of the method. The order of the operations/processes may be interchangeable.

FIG. 1 illustrates a semiconductor substrate having transistors and one or more metal/dielectric layers 110 thereon. The semiconductor substrate may be a silicon substrate. Alternatively, the substrate may include another elementary semiconductor, such as germanium; a compound semiconductor including silicon carbide; an alloy semiconductor including silicon germanium; or combinations thereof. In some embodiments, the substrate is a semiconductor on insulator (SOI) substrate. The substrate may include doped regions, such as p-wells and n-wells. The transistors are formed by suitable transistor fabrication processes and may be a planar transistor, such as polysilicon gate transistors or high-k metal gate transistors, or a multi-gate transistor, such as fin field effect transistors. After the transistors are formed, one or more metal/dielectric layers 110 of a multi-level interconnect (MLI) is formed over the transistors.

The metal/dielectric layer 110 includes one or more conductive features 112 embedded in an inter-layer dielectric (ILD) layer 114. The ILD layer 114 may be silicon oxide, fluorinated silica glass (FSG), carbon doped silicon oxide, tetra-ethyl-ortho-silicate (TEOS) oxide, phosphosilicate glass (PSG), borophosphosilicate glass (BPSG), Black Diamond® (Applied Materials of Santa Clara, Calif.), amorphous fluorinated carbon, low-k dielectric material, the like or combinations thereof. The conductive features 112 may be aluminum, aluminum alloy, copper, copper alloy, titanium, titanium nitride, tantalum, tantalum nitride, tungsten, cobalt, the like, and/or combinations thereof. The substrate may also include active and passive devices, for example, underlying the metal/dielectric layers 110. These further components are omitted from the figures for clarity.

Figure 2:
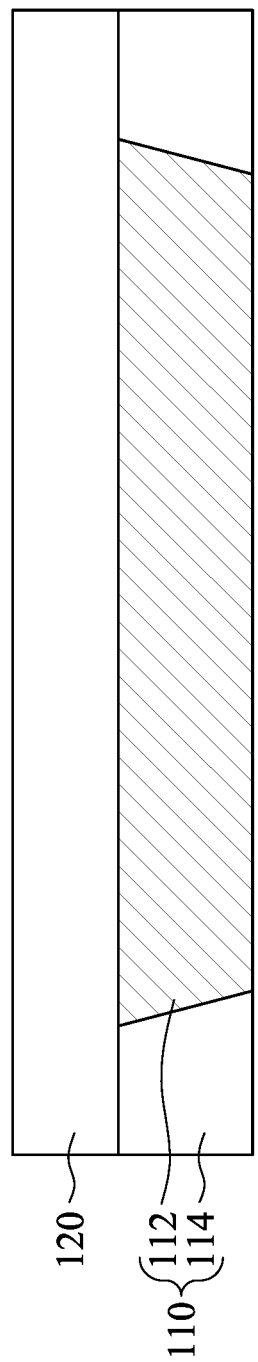

Reference is made to FIG. 2. A dielectric layer 120 may be formed on the metal/dielectric layer 110. The dielectric layer 120 may be silicon carbide, silicon oxynitride, silicon nitride, carbon doped silicon nitride or carbon doped silicon oxide. The dielectric layer 120 may include one or plural layers. In some embodiments, a material of a top layer of the dielectric layer 120 is selected to have a etch resistance property different from that of a bottom electrode material formed in subsequent processes. The dielectric layer 120 may has a material different from that of the inter-layer dielectric (ILD) layer 114. The dielectric layer 120 is deposited over the metal/dielectric layer 110 using a chemical vapor deposition (CVD) process such as plasma enhanced (PE) CVD, high-density plasma (HDP) CVD, inductively-coupled-plasma (ICP) CVD, or thermal CVD. In some embodiments, the dielectric layer 120 may have a thickness in a range from about 50 angstroms to about 1000 angstroms. If the thickness of the dielectric layer 120 is greater than about 1000 angstroms, a logic via may not be easily formed in the periphery region. If the thickness of the dielectric layer 120 is less than about 50 angstroms, the dielectric layer 120 may be too thinned, and defects formed over the dielectric layer 120 by etching processes may result in shorting issues.

Figure 3:
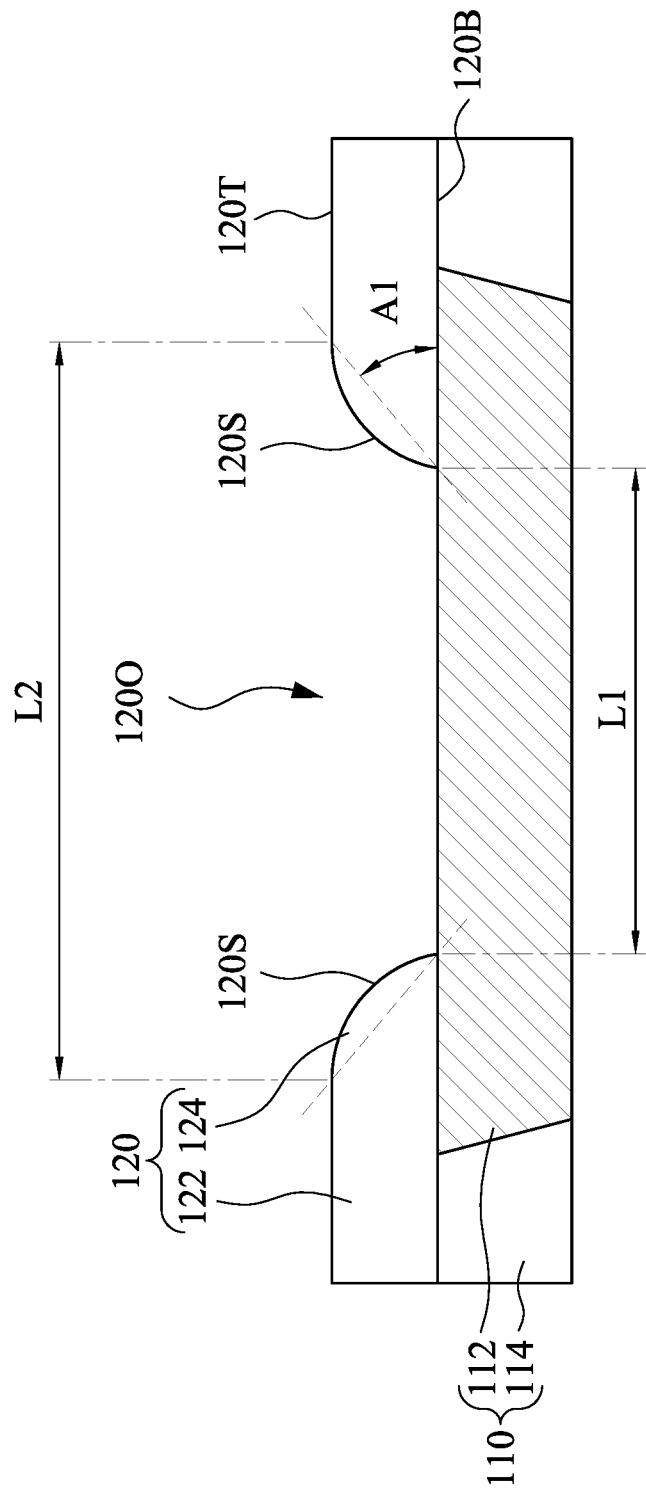

Reference is made to FIG. 3. An opening 120O is etched in the dielectric layer 120 to expose a portion of the conductive feature 112. In some embodiments, the etching process for forming the opening 120O may include suitable dry etch process. The etching process may be performed such that the opening 120O get wider at its top. For example, the dielectric layer 120 has a first portion 122 and a second portion 124 connected with the first portion 122. The first portion 122 may extend horizontally over the metal/dielectric layer 110 and keep substantially the same thickness. The second portion 124 may adjoin the opening 120O and have a thickness decreasing as approaching the opening 120O. For example, the second portion 124 may taper toward the opening 120O.

In other words, the dielectric layer 120 may have a tapered sidewall 120S surrounding the opening 120O, and the tapered sidewall 120S may be slanted with respect to a top surface of the substrate. The tapered sidewall 120S of the dielectric layer 120 may be connected between a top surface 120T and a bottom surface 120B of the dielectric layer 120, which may be substantially flat and parallel with a top surface of the substrate. The top surface 120T and the bottom surface 120B of the dielectric layer 120 may extends laterally from top and bottom ends of the tapered sidewall 120S of the dielectric layer 120. For example, an angle A1 between the tapered sidewall 120S (e.g., the dashed line from a top of the tapered sidewall 120S to a bottom of the tapered sidewall 120S) and the bottom surface 120B of the dielectric layer 120 may be in a range from about 5 degrees to about 75 degrees. If the angle A1 between the tapered sidewall 120S and the bottom surface 120B of the dielectric layer 120 is greater than about 75 degrees, a sidewall of the memory structure to be formed may land on the top surface 120T of the dielectric layer 120, which in turn will result in a step height between a top surface of the memory structure and the top surface 120T of the dielectric layer 120. If the angle A1 between the tapered sidewall 120S and the bottom surface 120B of the dielectric layer 120 is less than about 5 degrees, the dielectric layer 120 may be too thinned, and defects formed over the dielectric layer 120 by etching processes may result in shorting issues. In some embodiments, the tapered sidewall 120S may be curved, such as convex upward as shown in the figure. In some alternative embodiments, the tapered sidewall 120S may be concave upward. In some embodiments, the tapered sidewall 120S may not be curved.

The opening 120O may have a bottom width L1 adjacent to the bottom surface 120B of the dielectric layer 120 and a top width L2 adjacent to the top surface 120T of the dielectric layer 120O. The bottom width L1 of the opening 120O may define a critical dimension for a size of a BEVA to be formed. For example, the critical dimension (e.g., the bottom width L1 of the opening 120O) may be in a range from about 50 nanometers to about 500 nanometers in the present embodiments. If the critical dimension (e.g., the bottom width L1 of the opening 120O) is less than about 50 nanometers, a memory cell may have a raising portion on a top surface of the dielectric layer 120, which result in a step height between a top surface of the memory cell and a top surface of the dielectric layer 120, thereby creating a step height between the memory cell and a periphery region (e.g., logic region). If the critical dimension (e.g., the bottom width L1 of the opening 120O) is greater than about 500 nanometers, the memory cell may unnecessarily occupy too much chip area.

Figure 4:
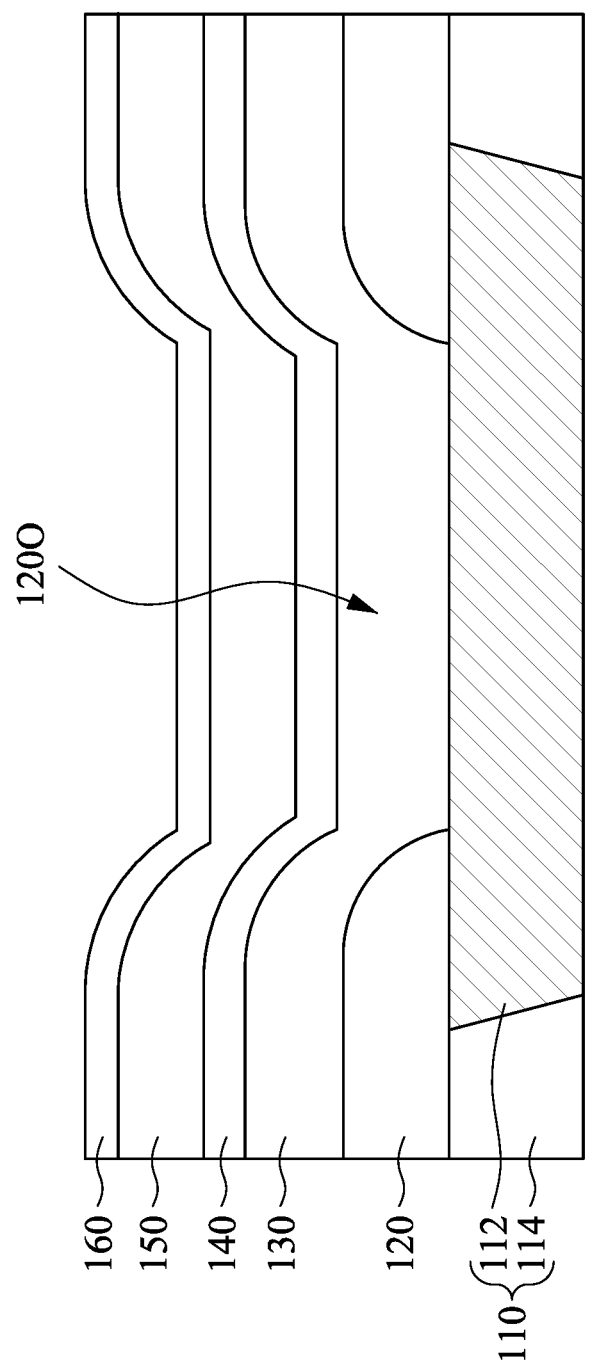

Reference is made to FIG. 4. A bottom electrode layer 130, a resistance switch layer 140, a top electrode layer 150, and a hard mask layer 160 are subsequently deposited on the dielectric layer 120.

In some embodiments, the bottom electrode layer 130 is deposited over the dielectric layer 120 and extending into the opening 120O. A portion of the bottom electrode layer 130 in the opening 120O may be referred to as BEVA in some embodiments. In some embodiments, the bottom electrode layer 130 fills the opening 120O. For example, a bottommost portion of a top surface of the bottom electrode layer 130 is higher than a top surface of the dielectric layer 120. In some embodiments, the bottom electrode layer 130 can be a single-layered structure or a multi-layered structure. For example, the bottom electrode layer 130 includes a diffusion barrier layer and one or more electrode layers over the diffusion barrier layer.

In some embodiments, the diffusion barrier layer is a titanium nitride (TiN) layer or a tantalum nitride (TaN) layer, which can act as a suitable barrier to prevent metal diffusion. Formation of the diffusion barrier layer may be exemplarily performed using CVD, PVD, ALD, the like, and/or a combination thereof. In some embodiments, the electrode layer(s) may include titanium (Ti), tantalum (Ta), platinum (Pt), ruthenium (Ru), tungsten (W), aluminum (Al), copper (Cu), TiN, TaN, Ni, Pd, or Co, the like, and/or combinations thereof. Formation of the electrode layer(s) may be exemplarily performed using CVD, PVD, ALD, the like, and/or a combination thereof.

In some embodiments, the resistance switch layer 140 is deposited over the bottom electrode layer 130. The resistance switch layer 140 includes a material having a variable resistance configured to undergo a reversible phase change between a high resistance state and a low resistance state. For example, the resistance switch layer 140 may include high-k films. In some embodiments, the resistance switch layer 140 is a metal oxide, which may be hafnium oxide, zirconium oxide, aluminum oxide, nickel oxide, tantalum oxide, titanium oxide, and other oxides used as a resistance switch layer. The metal oxide may have a non-stoichiometric oxygen to metal ratio. Depending on the method of deposition, the oxygen to metal ratio and other process conditions may be tuned to achieve specific resistance switch layer 140 properties. For example, a set of conditions may yield a low 'forming' voltage and another set of conditions may yield a low 'read' voltage. The metal oxide may be deposited. In some embodiments, the metal oxide is a transition metal oxide. In other embodiments, the resistance switch layer is a metal oxynitride.

The resistance switch layer 140 may be formed by a suitable technique, such as atomic layer deposition (ALD) with a precursor containing a metal and oxygen. Other chemical vapor deposition (CVD) techniques may be used. In another example, the resistance switch layer 140 may be formed by a physical vapor deposition (PVD), such as a sputtering process with a metallic target and with a gas supply of oxygen and optionally nitrogen to the PVD chamber. In yet another example, the resistance switch layer 140 may be formed an electron-beam deposition process.

The resistance switch layer 140 may have corresponding materials according to the type of the non-volatile memory cell to be formed. For example, in some other embodiments where the non-volatile memory cell to be formed is MRAM cell, the resistance switch layer 140 may be magnetic tunnel junction (MTJ), which has two ferromagnets separated by a thin insulator. In some other embodiments where the non-volatile memory cell to be formed is FeRAM cell, the resistance switch layer 140 may be a ferroelectric layer. In some other embodiments where the non-volatile memory cell to be formed is CBRAM cell, the resistance switch layer 140 may be a thin solid state electrolyte layer. In some other embodiments where the non-volatile memory cell to be formed is PCRAM, the resistance switch layer 140 includes a phase change material.

In some embodiments, the top electrode layer 150 is deposited over the resistance switch layer 140. The top electrode layer 150 may be metal, metal-nitride, doped polysilicon or other suitable conductive material. For example, the top electrode layer 150 may be tantalum nitride, titanium nitride, titanium, tantalum or platinum. The top electrode layer 150 may single or bilayer. The top electrode layer 150 may be formed by PVD, CVD, ALD, or other suitable technique. Alternatively, the top electrode 340 includes other suitable conductive material to electrically connect the device to other portion of an interconnect structure for electrical routing.

In some embodiments, the hard mask layer 160 is deposited over the top electrode layer 150. The hard mask layer 160 may be made of silicon nitride, silicon carbide, or other composite dielectric layers. In some embodiments, a silicon oxynitride is used. Silicon oxynitride has a good etch selectivity against the bottom electrode metal. Other hard mask material including silicon carbide, carbon-doped silicon nitride, or silicon nitride may be used.

In the present embodiments, the bottom electrode layer 130, the resistance switch layer 140, the top electrode layer 150, and the hard mask layer 160 have profiles conforming to the opening 120O in the dielectric layer 120. For example, each of the bottom electrode layer 130, the resistance switch layer 140, the top electrode layer 150, and the hard mask layer 160 has a recess above the opening 120O in the dielectric layer 120.

Figure 5:
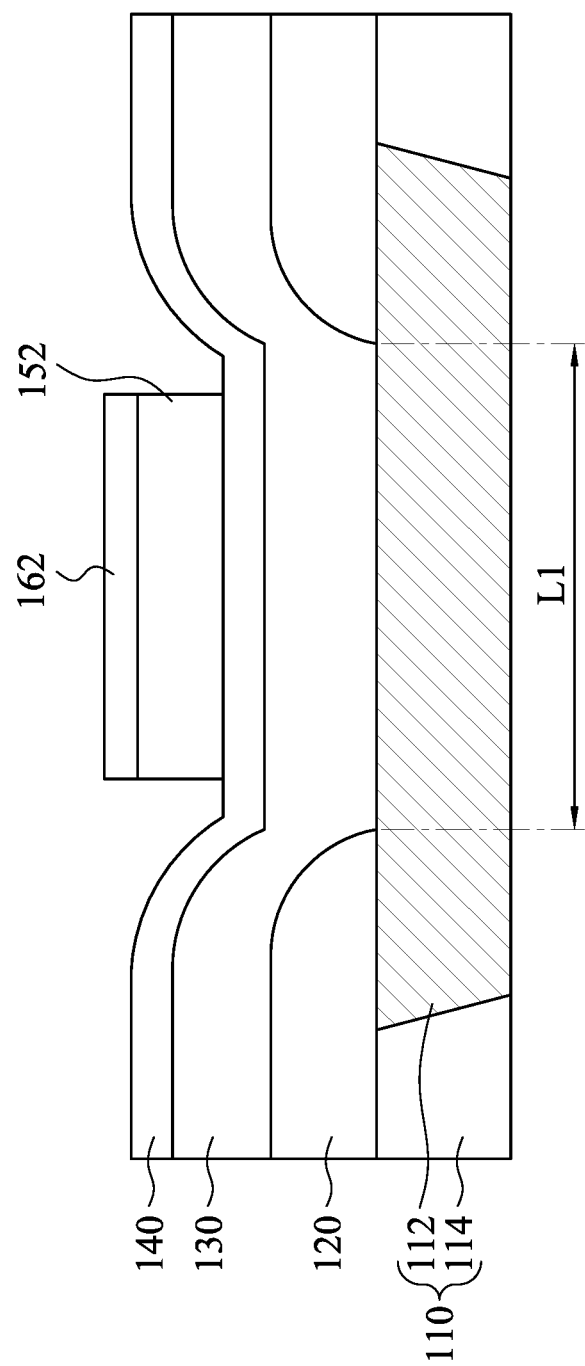

Reference is made to FIG. 5. The hard mask layer 160 and the top electrode layer 150 (referring to FIG. 4) are patterned into a hard mask 162 and a top electrode 152, respectively. The patterning process may include a photolithography operation where a photoresist is deposited over the hard mask layer 160 (referring to FIG. 4), a pattern is defined by exposing photoresist to a radiation, and developing the photoresist to create a photoresist pattern. The photoresist pattern is then used as an etch mask to protect desired portions of the hard mask layer 160 (referring to FIG. 4). The hard mask layer 160 (referring to FIG. 4) may then be patterned using an etching operation. In some embodiments, an etchant used to pattern the hard mask layer 160 (referring to FIG. 4) includes an etching chemistry including gases of $CF_4$, $CH_2F_2$ and/or other chemicals. The photoresist mask is removed after the patterning. In some embodiments, the photoresist mask can be removed by adding oxygen to the etchant. Subsequently, the hard mask 162 is used as an etchmask to pattern the top electrode layer 150 (referring to FIG. 4). In some embodiments, an etchant is applied to etch an exposed portion of the top electrode layer 150 (referring to FIG. 4) that is not covered by the hard mask 162. The etch process stops when the resistance switch layer 140 is reached. The resistance switch layer 140 may have a higher etch resistance to etching the top electrode layer 150 (referring to FIG. 4) than that of the top electrode layer 150 (referring to FIG. 10). Techniques are available to detect the end of etching when a new material layer is reached so as to reduce the amount of over etching. In some embodiments, a width of the bottom surface of the top electrode 152 is less than the bottom width L1 of the opening 120O in the dielectric layer 120.

Figure 6:
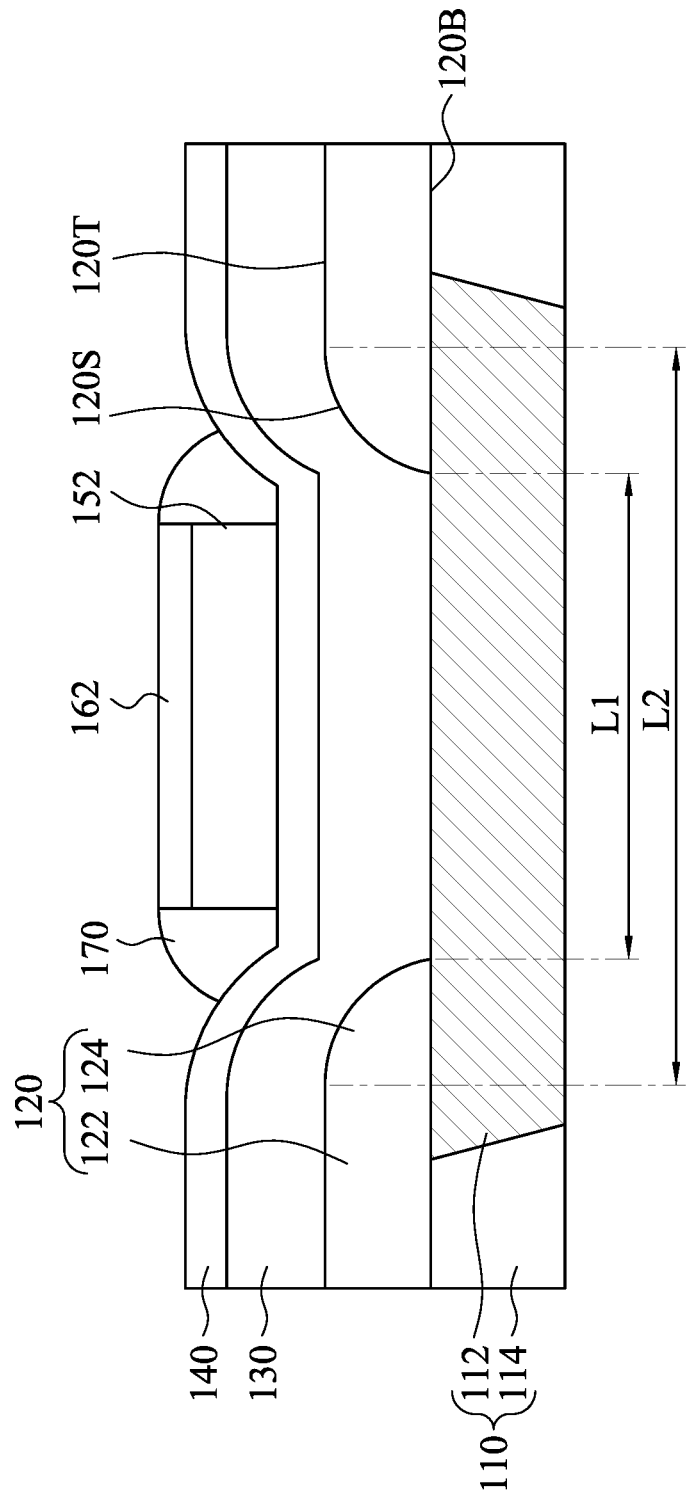

Reference is made to FIG. 6. One or more spacers 170 are formed on sidewalls of the hard mask 162 and the top electrode 152. The spacer 170 may be made of silicon nitride, silicon oxynitride, and silicon oxide. In some embodiments, the spacer 170 may be formed by conformally depositing a spacer material layer covering the top and sidewalls of the hard mask 162, sidewalls of the top electrode 152, and a top surface of the resistance switch layer 140. Subsequently, an anisotropic etch process may be performed to remove horizontal portions of the spacer material layer, and remain vertical portions of the spacer material layer, thereby forming the spacer 170. The spacer 170 surrounds the top electrode 152 and is over a portion of the resistance switch layer 140, and thus protects the top electrode 152 and the portion of the resistance switch layer 140 against subsequent etch operations. The height and width of the spacer 192 after etching may be tuned by adjusting deposition and etching parameters.

In some embodiments, a combination of a bottom surface of the spacer 170 and a bottom surface of the top electrode 152 has a width less than the top width L2 of the opening 120O in the dielectric layer 120. Through the configuration, the spacer 170 is directly over the conductive features 112 and the second portion 124 of the dielectric layer 120, not directly over the first portion 122 of the dielectric layer 120.

In other words, the spacer 170 may be directly over the tapered sidewall 120S, and not directly over the top surface 120T of the dielectric layer 120. For example, a sidewall of the spacer 170 may be aligned with the tapered sidewall 120S of the dielectric layer 120.

According to various embodiments, the spacer etching is performed without patterning using a patterned mask because the shape of the conformal spacer material layer can be etched to form the spacer 170. However, other spacer shapes may be formed by patterning the spacer material using a patterned mask. If a patterned mask is used, the spacer 170 may be formed of suitable shapes. For example, the spacer 170 may include a portion over the hard mask 162 and the top corners of the hard mask 162 so as to further protect the memory structure during bottom electrode etch.

Figure 7:
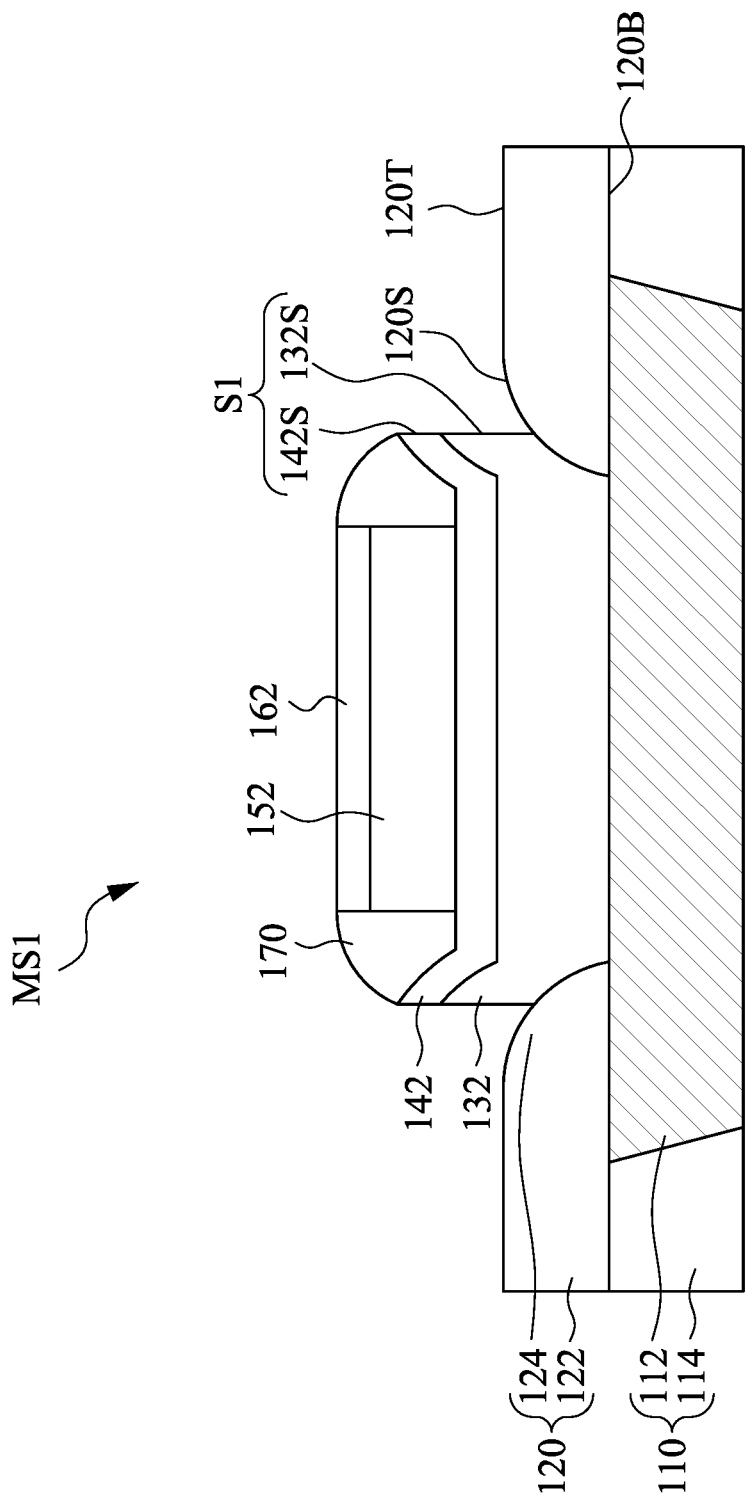

Then, reference is made to FIG. 7. The resistance switch layer 140 and the bottom electrode layer 130 (referring to FIG. 6) are patterned into a resistance switch element 142 and a bottom electrode 132, respectively. The patterning process may include suitable etching process, such as dry etches. The spacer 170 and the hard mask 162 are used as an etch mask to remove portions of the resistance switch layer 140 and the bottom electrode layer 130 (referring to FIG. 6). The dielectric layer 120 may serve as an etch stop layer when removing the portions of the resistance switch layer 140 and the bottom electrode layer 130 (referring to FIG. 6). For example, the dielectric layer 120 may have a higher etch resistance to etching the resistance switch layer 140 and the bottom electrode layer 130 than that of the resistance switch layer 140 and the bottom electrode layer 130 (referring to FIG. 6). Through the operations, a memory structure MS1 is formed, and the memory structure MS1 includes the bottom electrode 132, the resistance switch element 142 over the bottom electrode 132, and the top electrode 152 over the resistance switch element 142.

According to the profiles of the spacer 170 and the hard mask 162, the resistance switch element 142 and the bottom electrode 132 would be directly over the conductive features 112 and the second portion 124 of the dielectric layer 120, not directly over the first portion 122 of the dielectric layer 120. In other words, the resistance switch element 142 and the bottom electrode 132 may be directly over the tapered sidewall 120S, and not directly over the top surface 120T of the dielectric layer 120. The top surface 120T of the dielectric layer 120 may be free of coverage of the bottom electrode 132. For example, the sidewall 132S of the bottom electrode 132 may land on the tapered sidewall 120S of the dielectric layer 120. In some embodiments, the sidewall 142S of the resistance switch element 142 and the sidewall 132S of the bottom electrode 132 in combination may be referred to as a sidewall S1 of the memory structure MS1, and the sidewall S1 of the memory structure MS1 may land on the tapered sidewall 120S of the dielectric layer 120. The tapered sidewall 120S of the dielectric layer 120 may have a first portion covered by the bottom electrode 132 and a second portion free of coverage of the bottom electrode 132. Through the configuration, the memory structure MS1 is prevented from being formed on the flat top surface 120T of the dielectric layer 120, thereby reducing a step height between a top surface of the memory structure MS1 and the top surface 120T of the dielectric layer 120.

Figure 8:
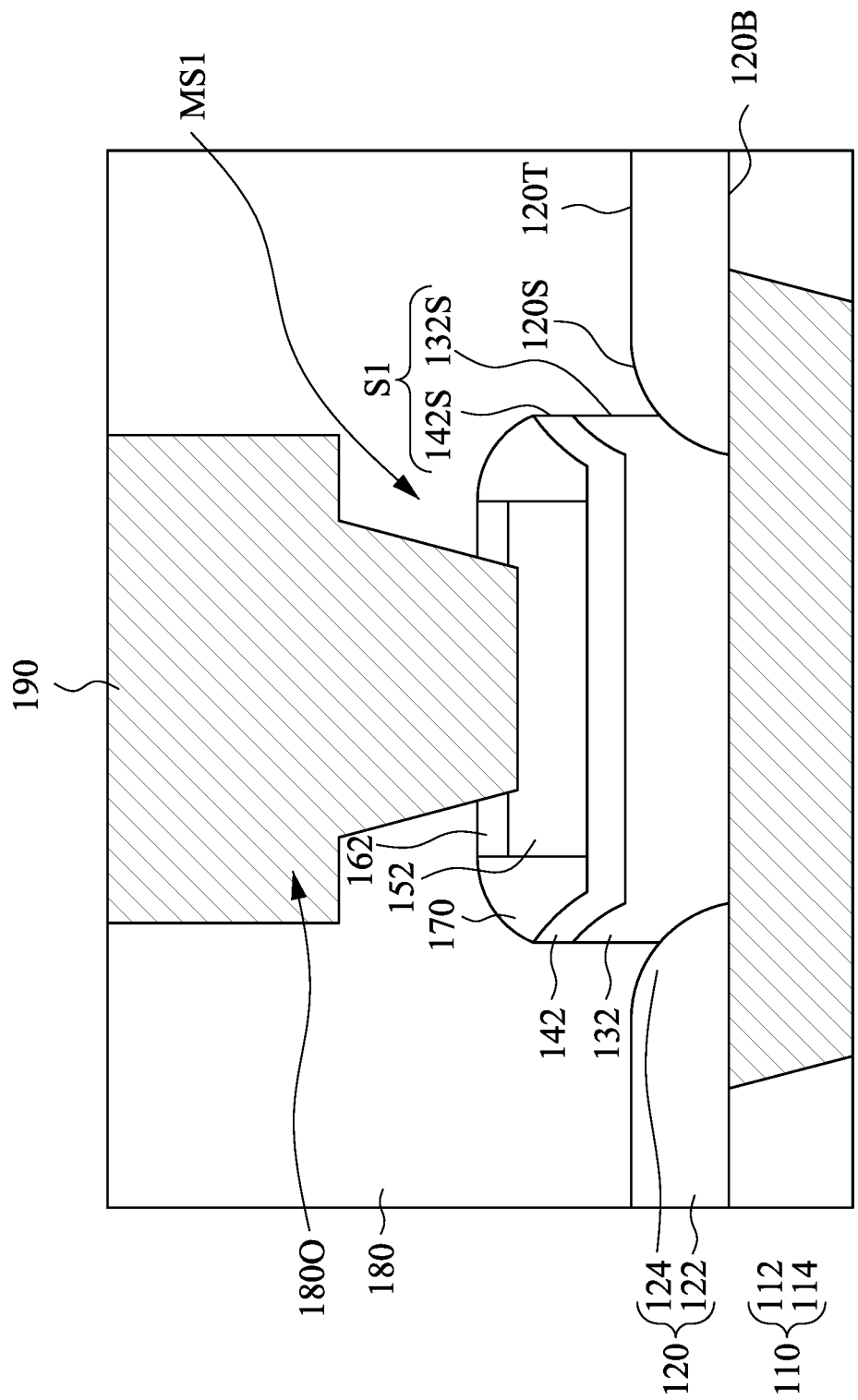

Reference is made to FIG. 8. An inter-layer dielectric layer 180 is deposited over the memory structure MS1 and the metal/dielectric layer 110 using suitable deposition techniques. The inter-layer dielectric layer 180 may be silicon oxide, extreme or extra low-k silicon oxide such as a porous silicon oxide layer, or other commonly used inter-layer dielectric material. In some embodiments, the techniques for depositing the inter-layer dielectric layer 180 may be referred to as a low-k dielectric gap fill process. The inter-layer dielectric layer 180 may has a material different from that of the dielectric layer 120. In some embodiments of the present disclosure, by fabricating the memory cell such that sidewalls of the memory cell are landing on a slant sidewall of the dielectric layer, a step height between a top surface of the memory cell and a top surface of the dielectric layer is reduced, which in turn may improve the process window of the low-k dielectric gap fill process.

After the formation of the inter-layer dielectric layer 200, an opening 180O is etched in the inter-layer dielectric layer 180 to expose a top electrode 152. Subsequently, the opening 180O is filled with a conductive feature material, such as a metal. The conductive filling material may also include one or more liner and barrier layers in additional a metal conductor. The liner and/or barrier may be conductive and deposited using CVD or PVD. The metal may be deposited using PVD or one of the plating methods, such as electrochemical plating. After the filling, a planarization process, such as chemical mechanical polishing (CMP), is performed to remove excess conductive feature material, thereby forming a conductive feature 190 in the opening 180O. In some embodiments, the opening 180O may be a combination of a via opening and a trench opening, and the conductive feature 190 may act as a combination of a metal line and a conductive via. In some embodiments, the opening 180O may be a via opening, and the conductive feature 190 may act as a conductive via. In some other embodiments, the opening 180O may be a trench opening, and the conductive feature 190 may act as a metal line.

Figure 9:
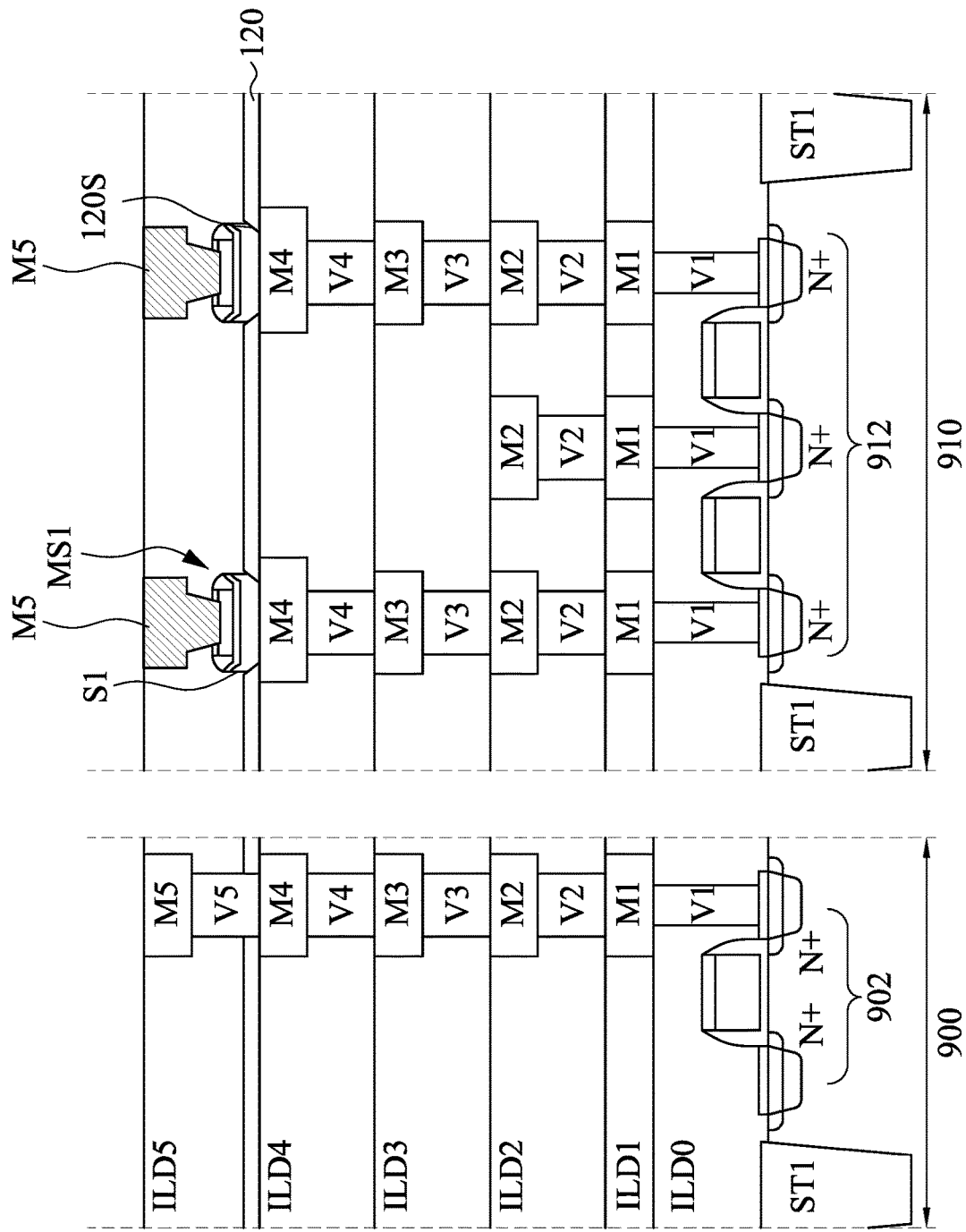
FIG. 9 is a cross-sectional view of an integrated circuit in accordance with some embodiments of the present disclosure.

FIG. 9 is a cross-sectional view of a semiconductor device in accordance with some embodiments of the present disclosure. The semiconductor device includes a logic region 900 and a memory region 910. Logic region 900 may include circuitry, such as an exemplary logic transistor 902, for processing information received from the memory structures MS1 in the memory region 910 and for controlling reading and writing functions of the memory structures MS1. In some embodiments, the memory structures MS1 may be similar to those illustrated in FIG. 8. For example, the sidewall S1 of the memory structure MS1 is landing on the tapered sidewall 120S of the dielectric layer 120.

As depicted, the semiconductor device is fabricated using four metallization layers, labeled as M1 through M5, with five layers of metallization vias or interconnects, labeled as V1 through V5. Other embodiments may contain more or fewer metallization layers and a corresponding more or fewer number of vias. Logic region 900 includes a full metallization stack, including a portion of each of metallization layers M1-M5 connected by interconnects V2-V5, with V1 connecting the stack to a source/drain contact of logic transistor 902. The memory region 910 includes a full metallization stack connecting memory structures MS1 to transistors 912 in the memory region 910, and a partial metallization stack connecting a source line to transistors 912 in the memory region 910. Memory structures MS1 are depicted as being fabricated in between the top of the M4 layer and the bottom the M5 layer. Also included in semiconductor device is a plurality of ILD layers. Five ILD layers, identified as ILD0 through ILD5 are depicted in FIG. 9 as spanning the logic region 900 and the memory region 910. The ILD layers may provide electrical insulation as well as structural support for the various features of the semiconductor device during many fabrication process steps. In some embodiments, after the formation of the memory structure MS1, openings are etched in the ILD layer ILD5 and the dielectric layer 120 in the logic region 900, and the interconnect V5 is formed in the openings in the ILD layer ILD5 and the dielectric layer 120. The dielectric layer 120 may serve as an etch stop layer for stopping etching the ILD layer ILD5 during the formation of the openings for the interconnect V5.

Figure 10:
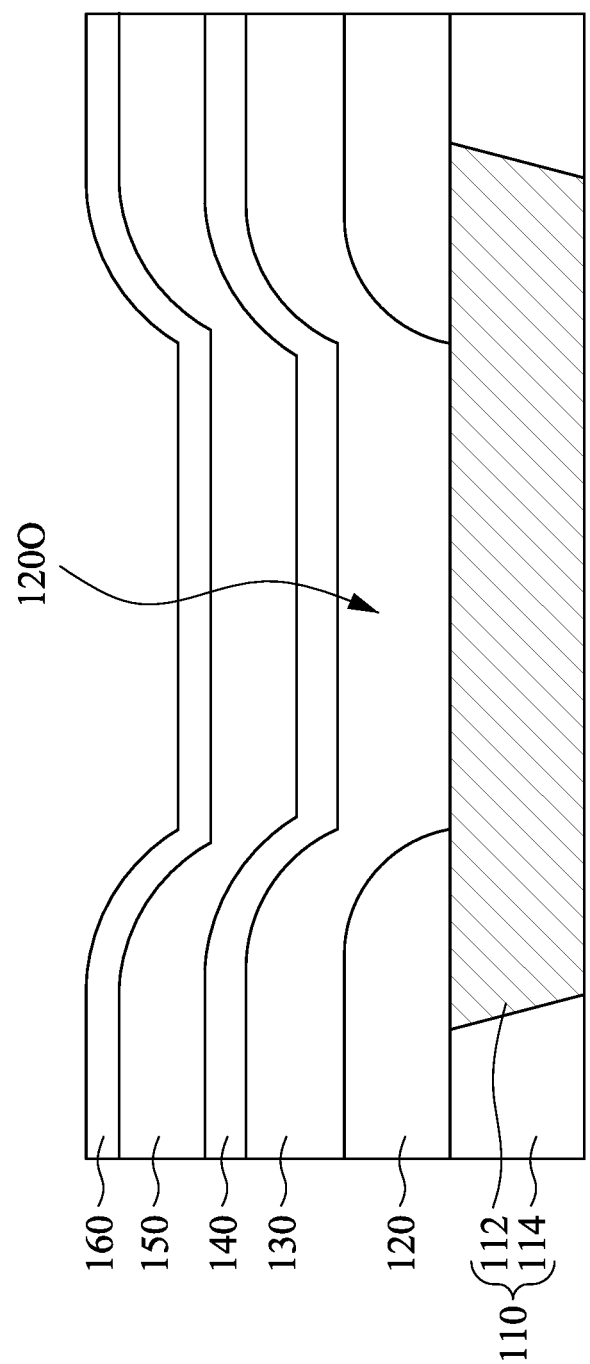
FIGS. 10-12 illustrate various stages in the formation of a memory device of an integrated circuit according to some embodiments of the present disclosure.
Figure 11:
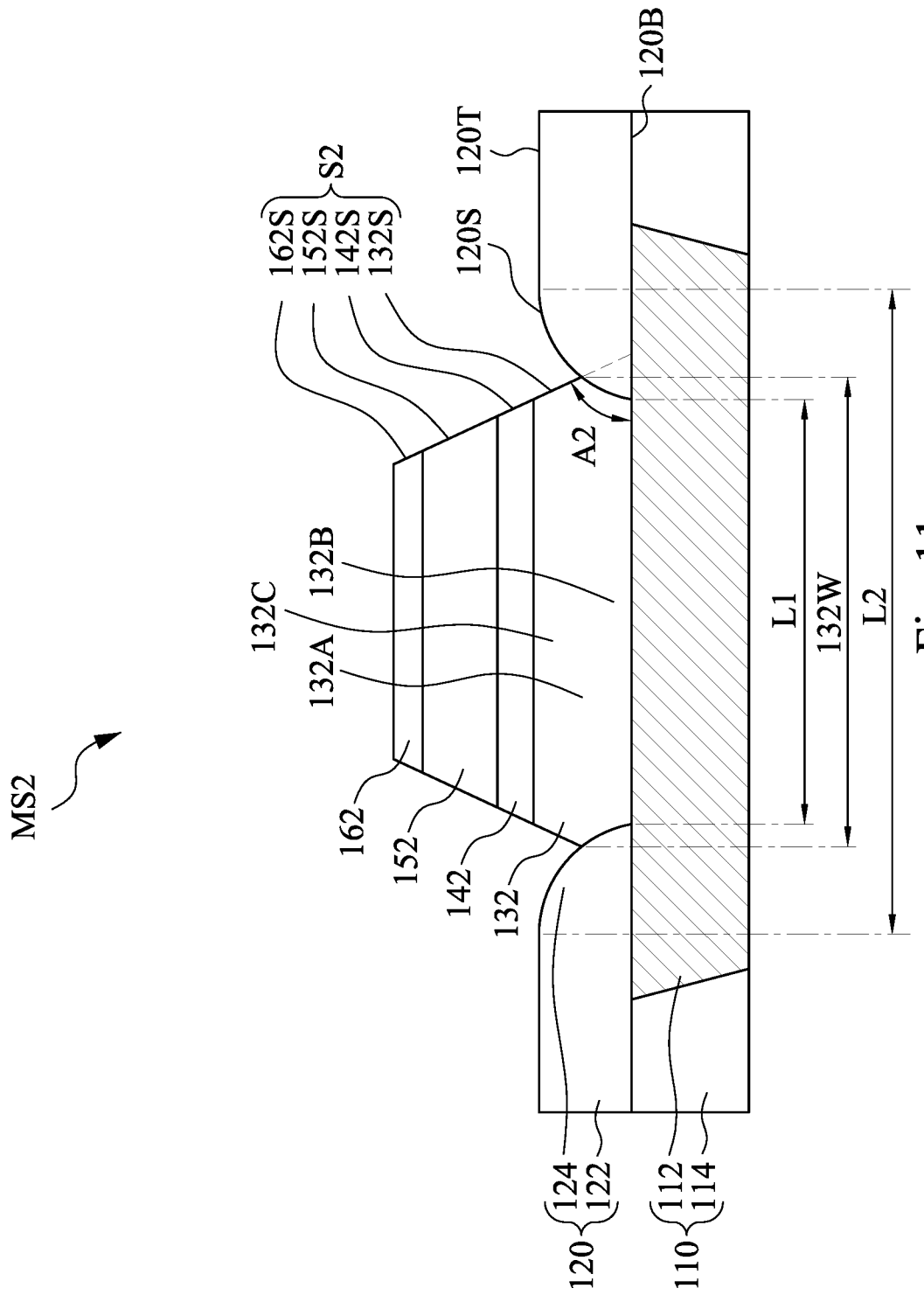
Figure 12:
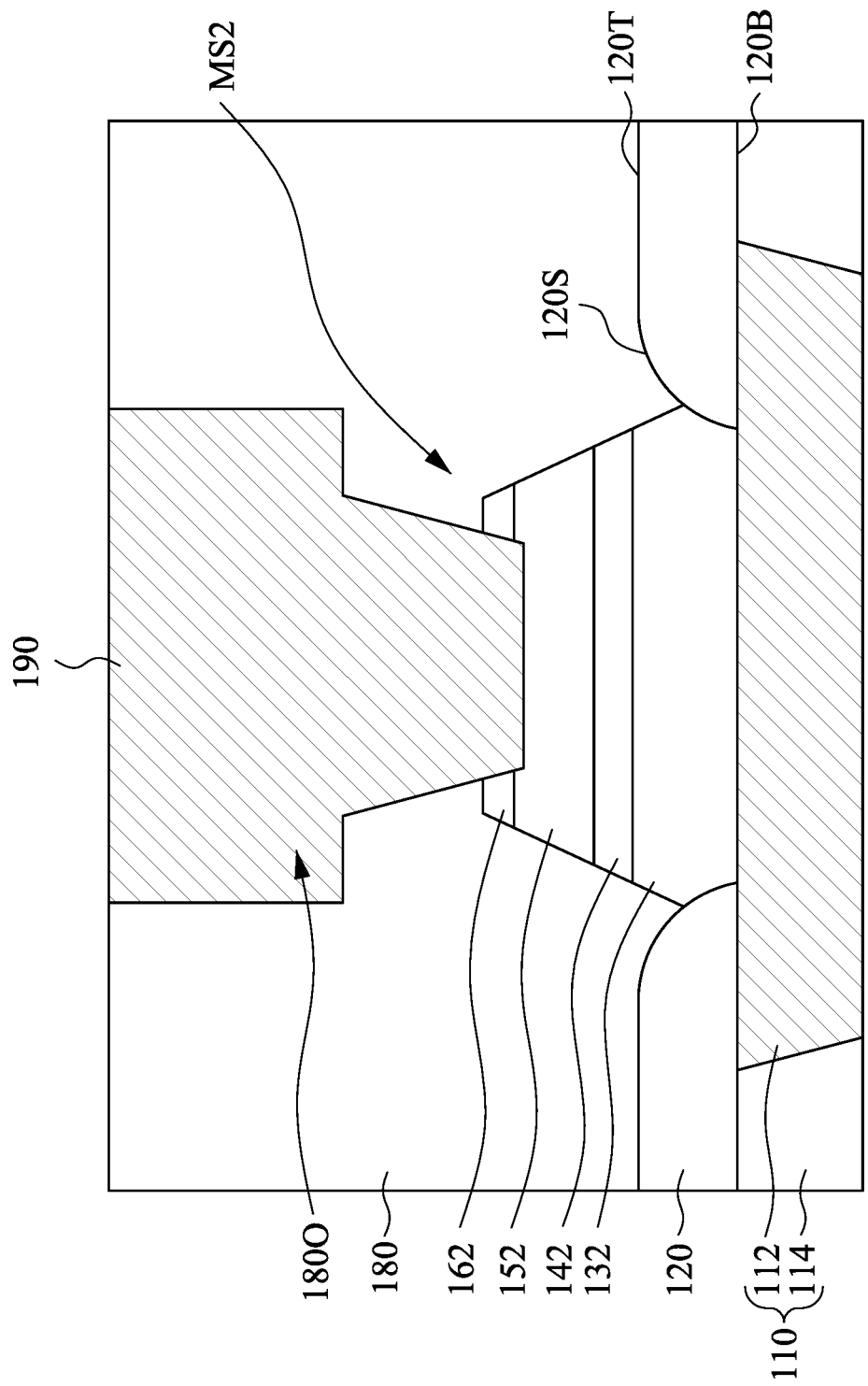

FIGS. 10-12 illustrate various stages in the formation of a memory device of an integrated circuit according to some embodiments of the present disclosure. The details of the present embodiments are similar to that of the embodiments of FIGS. 1-8, except that the patterning process of the layers 120-160 (referring to FIG. 4). For example, the spacer 170 (referring to FIG. 6) is omitted in the present embodiments. The illustration is merely exemplary and is not intended to limit beyond what is specifically recited in the claims that follow. It is understood that additional operations may be provided before, during, and after the operations shown by FIGS. 10-12, and some of the operations described below can be replaced or eliminated for additional embodiments of the method. The order of the operations/processes may be interchangeable.

FIG. 10 illustrates a semiconductor substrate having transistors and one or more metal/dielectric layers 110 thereon. A dielectric layer 120 may be formed on the metal/dielectric layer 110. An opening 120O is etched in the dielectric layer 120. The opening 120O exposes a portion of the conductive feature 112. A bottom electrode layer 130, a resistance switch layer 140, a top electrode layer 150, and a hard mask layer 160 are subsequently deposited on the dielectric layer 120. Other details may be the same as those illustrated in FIG. 4, and therefore not repeated herein.

Reference is made to FIG. 11. The hard mask layer 160, the top electrode layer 150, the resistance switch layer 140, and the bottom electrode layer 130 (referring to FIG. 10) are patterned into a hard mask 162, a top electrode 152, a resistance switch element 142, and a bottom electrode 132, respectively. Through the operations, a memory structure MS2 is formed, and the memory structure MS2 includes the bottom electrode 132, the resistance switch element 142 over the bottom electrode 132, the top electrode 152 over the resistance switch element 142, and the hard mask 162 over the top electrode 152.

The patterning process may include a photolithography operation where a photoresist is deposited over the hard mask layer 160 (referring to FIG. 10), a pattern is defined by exposing photoresist to a radiation, and developing the photoresist to create a photoresist pattern. The photoresist pattern is then used as an etch mask to protect desired portions of the hard mask layer 160 (referring to FIG. 10). The hard mask layer 160 (referring to FIG. 10) may then be patterned using an etching operation. In some embodiments, an etchant used to pattern the hard mask layer 160 (referring to FIG. 10) includes an etching chemistry including gases of $CF_4$, $CH_2F_2$ and/or other chemicals. The photoresist mask is removed after the patterning. In some embodiments, the photoresist mask can be removed by adding oxygen to the etchant. Subsequently, the hard mask 162 is used as an etch mask to pattern the top electrode layer 150, the resistance switch layer 140, and the bottom electrode layer 130 (referring to FIG. 10). In some embodiments, a dry etching process (e.g., plasma etching process) is performed to etch an exposed portion of the top electrode layer 150 (referring to FIG. 10) that is not covered by the hard mask 162. The dry etch process may use various etchant for etching the exposed portion of the top electrode layer 150, the resistance switch layer 140, and the bottom electrode layer 130 (referring to FIG. 10). The dry etch process may be performed with satiable bias power, such that the formed memory structure MS2 has a sidewall slanted with respect to a direction normal to a top surface 120T of the dielectric layer 120. The dry etch process stops when the dielectric layer 120 is reached. The dielectric layer 120 may have a higher etch resistance to the etchant used to etch the bottom electrode layer 130 (referring to FIG. 10) than that of the bottom electrode layer 130 (referring to FIG. 10). Techniques are available to detect the end of etching when a new material layer is reached so as to reduce the amount of over etching.

The memory structure MS2 may have a tapered profile. For example, sizes of the bottom electrode 132, the resistance switch element 142, the top electrode 152, and the hard mask 162 shrink as approaching a top of the memory structure MS2. In some embodiments, the memory structure MS2 may have a sidewall slanted with respect to a direction normal to a top surface 120T of the dielectric layer 120. The slant sidewall S2 of the memory structure MS2 may land on the tapered sidewall 120S of the dielectric layer 120. The tapered sidewall 120S of the dielectric layer 120 may have a first portion covered by the memory structure MS2 (e.g., the bottom electrode 132) and a second portion free of coverage of the memory structure MS2 (e.g., the bottom electrode 132). The top surface 120T of the dielectric layer 120 may be free of coverage of the bottom electrode 132. Through the configuration, the memory structure MS2 is prevented from being formed on the flat top surface 120T of the dielectric layer 120, thereby reducing a step height between a top surface of the memory structure MS2 and the top surface 120T of the dielectric layer 120.

The slant sidewall S2 may include a sidewall 132S of the bottom electrode 132, a sidewall 142S of the resistance switch element 142, a sidewall 152S of the top electrode 152, and a sidewall 162S of the hard mask 162. The sidewalls 132S-162S may be substantially aligned with each other. In some embodiments, an angle A2 between a slant sidewall S2 of the memory structure MS2 and the top surface of the substrate may be in a range from about 30 degrees to about 75 degrees. If the angle A2 between the sidewall S2 of the memory structure MS2 and the top surface of the substrate is greater than about 75 degrees, the sidewall S2 of the memory structure MS2 may land on the top surface 120T of the dielectric layer 120, which in turn will result in a step height between the top surface of the memory structure MS2 and the top surface 120T of the dielectric layer 120. If the angle A2 between the sidewall S2 of the memory structure MS2 and the top surface of the substrate is less than about 30 degrees, it may be not easy to land a top electrode via over the memory structure MS2, and an effect active area of the memory structure MS2 may be too small, such that current passing the memory structure MS2 may be too small, which in turn will lower the performance of the memory structure MS2.

In the present embodiments, for achieving the slant sidewall S2 of the memory structure MS2 and due to the presence of the tapered sidewall 120S of the dielectric layer 120, the bottom electrode 132 has a greatest width 132W at its middle. For example, the bottom electrode 132 has a greatest width 132W at a position lower than a top surface 120T of the dielectric layer 120. The greatest width 132W of the bottom electrode 132 may be greater than the bottom width L1 of the opening 120O but less than the top width L2 of the opening 120O. Through the configuration, the bottom electrode 132 is prevented from being formed on the flat top surface 120T of the dielectric layer 120, thereby reducing a step height between a top surface of the memory structure MS2 and the top surface 120T of the dielectric layer 120.

In some embodiments, the bottom electrode 132 has a first portion 132A, a second portion 132B below the first portion 132A, and a third portion 132C over the first portion 132A. In some embodiments, the first portion 132A of the bottom electrode 132 may be referred to the widest portion of the bottom electrode 132 (e.g., the portion having the greatest width 132W). For example, a width of the first portion 132A of the bottom electrode 132 is greater than a width of the second portion 132B of the bottom electrode 132 and a width of the third portion 132C of the bottom electrode 132. The second portion 132B of the bottom electrode 132 may taper downwards, and the third portion 132C of the bottom electrode 132 may taper upward. In some embodiments, the first portion 132A of the bottom electrode 132 (e.g., the portion having the greatest width 132W) is below the top surface 120T of the dielectric layer 120.

Reference is made to FIG. 12. An inter-layer dielectric layer 180 is deposited over the memory structure MS2 and the metal/dielectric layer 110 using suitable deposition techniques. The inter-layer dielectric layer 180 may be silicon oxide, extreme or extra low-k silicon oxide such as a porous silicon oxide layer, or other commonly used inter-layer dielectric material. After the formation of the inter-layer dielectric layer 200, an opening 180O is etched in the inter-layer dielectric layer 180 to expose a top electrode 152. Subsequently, the opening 180O is filled with a conductive feature material, such as a metal. The conductive filling material may also include one or more liner and barrier layers in additional a metal conductor. The liner and/or barrier may be conductive and deposited using CVD or PVD. The metal may be deposited using PVD or one of the plating methods, such as electrochemical plating. After the filling, a planarization process, such as chemical mechanical polishing (CMP), is performed to remove excess conductive feature material, thereby forming a conductive feature 190 in the opening 180O. In some embodiments, the opening 180O may be a via opening, and the conductive feature 190 may act as a conductive via. In some other embodiments, the opening 180O may be a trench opening, and the conductive feature 190 may act as a metal line.

Figure 13:
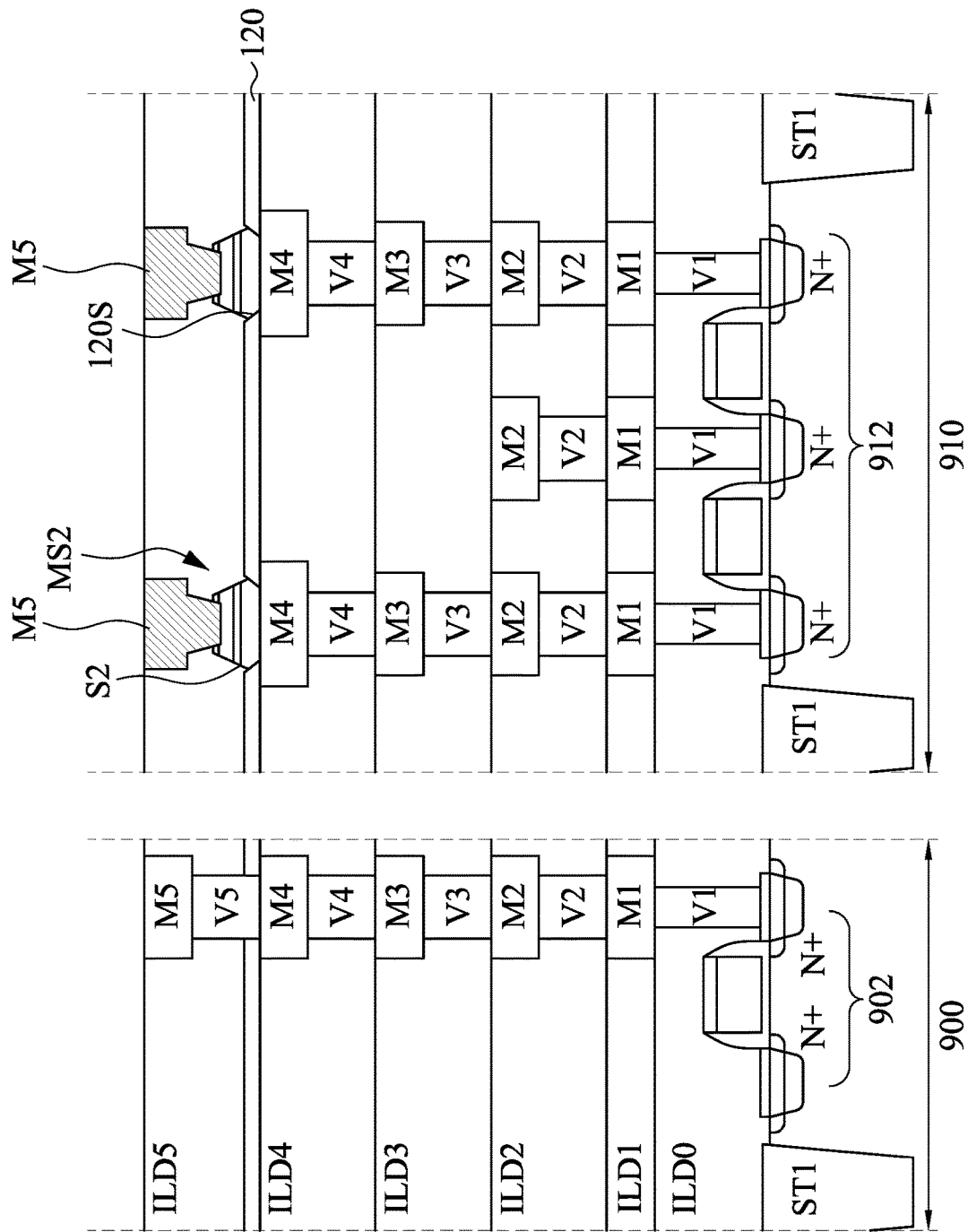
FIG. 13 is a cross-sectional view of an integrated circuit in accordance with some embodiments of the present disclosure.

FIG. 13 is a cross-sectional view of a semiconductor device in accordance with some embodiments of the present disclosure. As illustrated previously, the logic region 900 may include circuitry, such as an exemplary logic transistor 902, for processing information received from the memory structures MS2 in the memory region 910 and for controlling reading and writing functions of the memory structures MS2. In some embodiments, the memory structures MS2 may be similar to those illustrated in FIG. 12. For example, the sidewall S2 of the memory structure MS2 is landing on the tapered sidewall 120S of the dielectric layer 120. As depicted, the semiconductor device is fabricated using four metallization layers, labeled as M1 through M5, with five layers of metallization vias or interconnects, labeled as V1 through V5. Other details may be the same as those illustrated in FIG. 9, and therefore not repeated herein.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the memory cell is fabricated such that sidewalls of the memory cell are landing on a slant sidewall of the dielectric layer, thereby reducing the step height between a top surface of the memory cell and a top surface of the dielectric layer (e.g., a step height between the memory cell and the periphery region), which in turn may improve subsequently low-k dielectric gap fill process window. Another advantage is that the IC structure is applicable to be integrated with thinner back-end of line (BEOL) inter-metal dielectric (IMD) technology. Still advantage is that the memory cell may have a tapered profile for landing the sidewall sidewalls of the memory cell on the slant sidewall of the dielectric layer, and the plural layers of the memory cell may be patterned without spacers, thereby saving the cost.

According to some embodiments of the present disclosure, an integrated circuit includes a metal/dielectric layer, a second dielectric layer, a bottom electrode, a resistance switch element, and a top electrode. The metal/dielectric layer has a first dielectric layer and a conductive feature in the first dielectric layer. The second dielectric layer is over the metal/dielectric layer. The bottom electrode is over the conductive feature and surrounded by the second dielectric layer, in which the bottom electrode has a sidewall landing on a tapered sidewall of the second dielectric layer. The resistance switch element is over the bottom electrode. The top electrode is over the resistance switch element.

According to some embodiments of the present disclosure, an integrated circuit includes a metal/dielectric layer, a second dielectric layer, a memory structure, an interlayer dielectric layer, and a top electrode. The metal/dielectric layer has a first dielectric layer and a conductive feature in the first dielectric layer. The second dielectric layer is over the metal/dielectric layer. The memory structure is over the conductive feature and surrounded by the second dielectric layer. The memory structure has a sidewall in contact with a tapered sidewall of the second dielectric layer. The inter-layer dielectric layer is over the second dielectric layer and surrounding the memory structure. The top electrode is in the interlayer dielectric layer and over the memory structure.

According to some embodiments of the present disclosure, an integrated circuit includes a metal/dielectric layer having a first dielectric layer and a conductive feature in the first dielectric layer; a second dielectric layer over the metal/dielectric layer, wherein the second dielectric layer has a top surface and a tapered sidewall extending from the top surface to the conductive feature; a bottom electrode over the conductive feature and in contact with the tapered sidewall of the second dielectric layer, wherein a top end of the tapered sidewall of the second dielectric layer is free from coverage by the bottom electrode; a resistance switch element over the bottom electrode; and a top electrode over the resistance switch element.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit, comprising:
   a metal/dielectric layer having a first dielectric layer and a conductive feature in the first dielectric layer;
   a second dielectric layer over the metal/dielectric layer;

a bottom electrode over the conductive feature and surrounded by the second dielectric layer, wherein the bottom electrode has a sidewall landing on a tapered sidewall of the second dielectric layer;

a resistance switch element over the bottom electrode; and a top electrode over the resistance switch element.

2. The integrated circuit of claim 1, wherein a portion of the tapered sidewall of the second dielectric layer is free from coverage by the bottom electrode.

3. The integrated circuit of claim 1, wherein the sidewall of the bottom electrode, a sidewall of the resistance switch element, and a sidewall of the top electrode are aligned with each other.

4. The integrated circuit of claim 1, wherein the bottom electrode has a first portion, a second portion below the first portion, and a third portion over the first portion, and a width of the first portion of the bottom electrode is greater than a width of the second portion of the bottom electrode and a width of the third portion of the bottom electrode.

5. The integrated circuit of claim 4, wherein the first portion of the bottom electrode is below a top surface of the second dielectric layer.

6. The integrated circuit of claim 1, further comprising:

a spacer surrounding the top electrode and over the resistance switch element.

7. The integrated circuit of claim 1, wherein the tapered sidewall of the second dielectric layer is curved.

8. The integrated circuit of claim 1, wherein the second dielectric layer is a silicon carbide layer.

9. The integrated circuit of claim 1, wherein an angle between the tapered sidewall of the second dielectric layer and a bottom surface of the second dielectric layer is in a range from 5 degrees to 75 degrees.

10. An integrated circuit, comprising:

a metal/dielectric layer having a first dielectric layer and a conductive feature in the first dielectric layer;

a second dielectric layer over the metal/dielectric layer;

a memory structure over the conductive feature and surrounded by the second dielectric layer, wherein the memory structure has a sidewall in contact with a tapered sidewall of the second dielectric layer;

an interlayer dielectric layer over the second dielectric layer and surrounding the memory structure; and a top electrode in the interlayer dielectric layer and over the memory structure.

11. The integrated circuit of claim 10, wherein the memory structure comprises a bottom electrode and a resistance switch element over the bottom electrode, the bottom electrode has a bottom portion, a middle portion, and a top portion, and the middle portion is wider than the bottom portion and the top portion.

12. The integrated circuit of claim 11, wherein the middle portion of the bottom electrode has a greatest width at a position lower than a top surface of the second dielectric layer.

13. The integrated circuit of claim 10, wherein the sidewall of the memory structure is slanted with respect to a top surface of the conductive feature.

14. The integrated circuit of claim 10, wherein an angle between the sidewall of the memory structure and a top surface of the conductive feature is in a range from 30 degrees to 75 degrees.

15. An integrated circuit, comprising:

a metal/dielectric layer having a first dielectric layer and a conductive feature in the first dielectric layer;

a second dielectric layer over the metal/dielectric layer, wherein the second dielectric layer has a top surface and a tapered sidewall extending from the top surface to the conductive feature;

a bottom electrode over the conductive feature and in contact with the tapered sidewall of the second dielectric layer, wherein a top end of the tapered sidewall of the second dielectric layer is free from coverage by the bottom electrode;

a resistance switch element over the bottom electrode; and a top electrode over the resistance switch element.

16. The integrated circuit of claim 15, wherein a bottom end of the tapered sidewall of the second dielectric layer is covered by the bottom electrode.

17. The integrated circuit of claim 15, wherein a top surface of the bottom electrode is higher than a top surface of the second dielectric layer.

18. The integrated circuit of claim 15, wherein the top surface of the second dielectric layer is substantially parallel with the top surface to the conductive feature.

19. The integrated circuit of claim 15, wherein the second dielectric layer comprises a material different from that of the first dielectric layer.

20. The integrated circuit of claim 15, wherein the tapered sidewall of the second dielectric layer is curved.

* * * * *